United States Patent
Clark et al.

(10) Patent No.: US 10,574,161 B2
(45) Date of Patent: Feb. 25, 2020

(54) SYSTEM AND COMPUTER-IMPLEMENTED METHOD FOR REDUCING ANGLE ERROR IN ELECTRIC MOTORS

(71) Applicant: Nidec Motor Corporation, St. Louis, MO (US)

(72) Inventors: Bret S. Clark, Oakville, MO (US); Christopher D. Schock, O'Fallon, MO (US); Michael I. Henderson, North Yorkshire (GB)

(73) Assignee: Nidec Motor Corporation, St. Louis, MO (US)

( * ) Notice: Subject to any disclaimer, the term of this patent is extended or adjusted under 35 U.S.C. 154(b) by 0 days.

(21) Appl. No.: 16/137,864

(22) Filed: Sep. 21, 2018

(65) Prior Publication Data

US 2019/0097555 A1 Mar. 28, 2019

Related U.S. Application Data

(60) Provisional application No. 62/562,220, filed on Sep. 22, 2017.

(51) Int. Cl.
| | |
|---|---|
| *H02P 6/185* | (2016.01) |
| *H02P 6/17* | (2016.01) |
| *G01R 31/34* | (2020.01) |
| *H02K 11/27* | (2016.01) |
| *H02K 11/21* | (2016.01) |
| *H02P 6/34* | (2016.01) |

(52) U.S. Cl.
CPC ............ *H02P 6/185* (2013.01); *G01R 31/343* (2013.01); *H02K 11/21* (2016.01); *H02K 11/27* (2016.01); *H02P 6/17* (2016.02); *H02P 6/34* (2016.02)

(58) Field of Classification Search
CPC ....................................................... H02P 6/185
USPC .................................................. 318/490, 34
See application file for complete search history.

(56) References Cited

U.S. PATENT DOCUMENTS 6,396,229 B1 * 5/2002 Sakamoto ................ H02P 6/18
 318/400.02
2010/0109584 A1 5/2010 Kwon et al.
(Continued)

OTHER PUBLICATIONS

PCT International Search Report and Written Opinion from PCT Application No. PCT/US2018/052258 entitled System and Computer-Implemented Method for Reducing Angle Error in Electric Motors (dated Jan. 18, 2019).

*Primary Examiner* — David Luo
(74) *Attorney, Agent, or Firm* — Hovey Williams LLP

(57) ABSTRACT

A system and computer-implemented method for reducing an angle error in an estimated position of a rotor over various loads on an electric motor or type of electric motor. Electrical parameters of an electric motor are measured, a true rotor position is found, and sensorless gains based on the measured parameters are generated, including determining a sensorless angle. Data is gathered at multiple torque levels for at least one speed of the motor, including for each torque level, trying different inductance values, and determining an inductance value that results in an angle error of zero. The angle error is the difference between the true rotor position and the sensorless angle. The inductance value that results in an angle error of zero for each speed may be saved in an electronic memory and used to better control the motor or other motors of the same type.

20 Claims, 5 Drawing Sheets

(56) References Cited

U.S. PATENT DOCUMENTS

| | | |
|---|---|---|
| 2012/0181962 A1 | 7/2012 | Scheit et al. |
| 2013/0175955 A1 | 7/2013 | Son et al. |
| 2014/0049202 A1 | 2/2014 | Fukumaru et al. |
| 2016/0233804 A1 | 8/2016 | Furutani et al. |

* cited by examiner

SYSTEM AND COMPUTER-IMPLEMENTED METHOD FOR REDUCING ANGLE ERROR IN ELECTRIC MOTORS

RELATED APPLICATIONS

The present U.S. non-provisional patent application is related to and claims priority benefit of an earlier-filed U.S. provisional patent application with the same title, Ser. No. 62/562,220, filed Sep. 22, 2017. The entire content of the earlier-filed application is incorporated into the present application as if fully set forth herein.

FIELD

The present invention relates to systems and methods for controlling the operation of electric motors, and more particularly, embodiments concern a system and computer-implemented method for reducing an angle error in an estimated position of a rotor over various loads on an electric motor or type of electric motor.

BACKGROUND

It is generally desirable for electric motors, including spoked magnet motors, to achieve the best torque-per-amp operating points. At such operating points, the motor uses the minimum current necessary to drive the output torque. This may be accomplished by synchronizing the stator and rotor, but doing so requires knowing the position of the rotor as accurately as possible. One way to directly determine the position of the rotor is to use a Hall effect sensor, encoder, or resolver in the motor.

Another way to determine the position of the rotor is to use a sensorless algorithm based on back electromotive force (EMF), inductance, and resistance to predict the position of the rotor. Sensorless algorithms are relatively accurate, but under some conditions can be sufficiently inaccurate so as to significantly lower motor efficiency. Angle errors of three degrees (3°) or less may have little or no significant effect, but angle errors of six degrees (6°) or seven (7°) degrees may lower motor efficiency by approximately one-half percent (0.5%) and increase motor phase current by approximately one percent (1%). Given that the difference between normal and high performance motors may be as little as three percent (3%), even relatively small angle errors can significantly lower motor efficiency.

This background discussion is intended to provide information related to the present invention which is not necessarily prior art.

SUMMARY

Embodiments of the present invention solve the above-described and other problems and limitations by providing a system and computer-implemented method for reducing an angle error in an estimated position of a rotor over various loads on an electric motor or type of electric motor. With more accurate angle information, the correlation between current and torque may be more accurately determined, which allows motor manufacturers to reduce performance margins while still meeting users' performance requirements.

In an embodiment, a computer-implemented method may be provided for improving the functioning of a computer for reducing an angle error in an estimated position of a rotor over a plurality of loads in an electric motor. The computer-implemented method may include the following steps. Data may be gathered at a plurality of torque levels for at least one speed of the electric motor, including for each torque level, trying a plurality of different inductance values, and an inductance value that results in an angle error of zero may be determined. The inductance value that results in an angle error of zero for each speed may be saved in an electronic memory of a motor controller of the electric motor. The inductance value that results in an angle error of zero for each speed of the at least one speed may be used by the motor controller to control operation of the electric motor, including synchronizing the rotor and a stator.

In another embodiment, a computer-implemented method may be provided for improving the functioning of a motor controller for reducing an angle error in an estimated position of a rotor over a plurality of loads in a type of electric motor, wherein the type of electric motor has the rotor, a stator, a shaft, an encoder mounted on the shaft, and a plurality of windings. The computer-implemented method may include the following steps. One or more electrical parameters of a representative electric motor of the type of electric motor may be measured. A true rotor position of the rotor of the representative electric motor may be found. Sensorless gains based on the one or more motor parameters may be generated, including determining a sensorless angle. Data may be gathered at a plurality of torque levels for at least one speed of the representative electric motor, including for each torque level, a plurality of different inductance values may be tried, and an inductance value that results in an angle error of zero may be determined, wherein the angle error is a difference between the true rotor position and the sensorless angle. The inductance value that results in an angle error of zero for each speed may be saved in an electronic memory of the motor controller of each electric motor of a plurality of electric motors of the type of electric motor. The inductance value that results in an angle error of zero for each speed of the at least one speed may be used by the motor controller of each electric motor to control operation of each electric motor of the plurality of electric motors, including synchronizing the rotor and the stator.

Various implementations of the foregoing embodiments may include any one or more of the following additional features. The one or more parameters may include voltage, current, and power. Finding the true rotor position may include positioning the shaft of the electric motor or representative electric motor in a known location, energizing two windings to lock the rotor, performing a zeroing process, moving the shaft to a next position and repeating the zeroing process, repeating the foregoing steps for each pole of a plurality of poles in the electric motor, and averaging the encoder offsets for each pole to obtain a final encoder offset, wherein the final encoder offset is the true rotor position, and saving the true rotor position in an electronic memory. The zeroing process may include reading an encoder theta, adjusting an encoder offset so that the encoder theta is close to zero, and recording the encoder offset. Energizing the two windings may include connecting a positive lead of a direct current power supply to a C phase winding of the representative electric motor, connecting a negative lead of the direct current power supply to a B phase winding of the representative electric motor, and leaving an A phase winding of the representative electric motor open, wherein the direct current power supply generates at least one-half the rated phase current of the representative electric motor. There may be between three and six torque levels, and/or there may be between two and six speeds. The computer-implemented method may further include, given the data from the plurality of different inductance values, using interpolation to find the inductance value that results in the angle error of zero.

This summary is not intended to identify essential features of the present invention, and is not intended to be used to limit the scope of the claims. These and other aspects of the present invention are described below in greater detail.

DRAWINGS

Embodiments of the present invention are described in detail below with reference to the attached drawing figures, wherein.

The figures are not intended to limit the present invention to the specific embodiments they depict. The drawings are not necessarily to scale.

DETAILED DESCRIPTION

The following detailed description of embodiments of the invention references the accompanying figures. The embodiments are intended to describe aspects of the invention in sufficient detail to enable those with ordinary skill in the art to practice the invention. Other embodiments may be utilized and changes may be made without departing from the scope of the claims. The following description is, therefore, not limiting. The scope of the present invention is defined only by the appended claims, along with the full scope of equivalents to which such claims are entitled.

In this description, references to "one embodiment", "an embodiment", or "embodiments" mean that the feature or features referred to are included in at least one embodiment of the invention. Separate references to "one embodiment", "an embodiment", or "embodiments" in this description do not necessarily refer to the same embodiment and are not mutually exclusive unless so stated. Specifically, a feature, structure, act, etc. described in one embodiment may also be included in other embodiments, but is not necessarily included. Thus, particular implementations of the present invention can include a variety of combinations and/or integrations of the embodiments described herein.

Broadly characterized, embodiments provide a system and computer-implemented method for reducing an angle error in an estimated position of a rotor over various loads on an electric motor or type of electric motor. Inductance varies with current, so embodiments may determine how inductance actually varies with current in a particular motor or in a representative motor of a particular type of motor, and then rather than use a fixed inductance value in the sensorless algorithm, allow inductance to vary with current in the sensorless algorithm in order to reduce angle error in the estimated position of the rotor. Based on the estimated position of the rotor, the proper voltage and/or current to be applied to the motor may be determined to better synchronize the stator and the rotor during the next time step. Thus, with more accurate angle information, the correlation between current and torque may be more accurately determined, and this may allow motor manufacturers to reduce performance margins while still meeting users' performance requirements.

Figure 1:
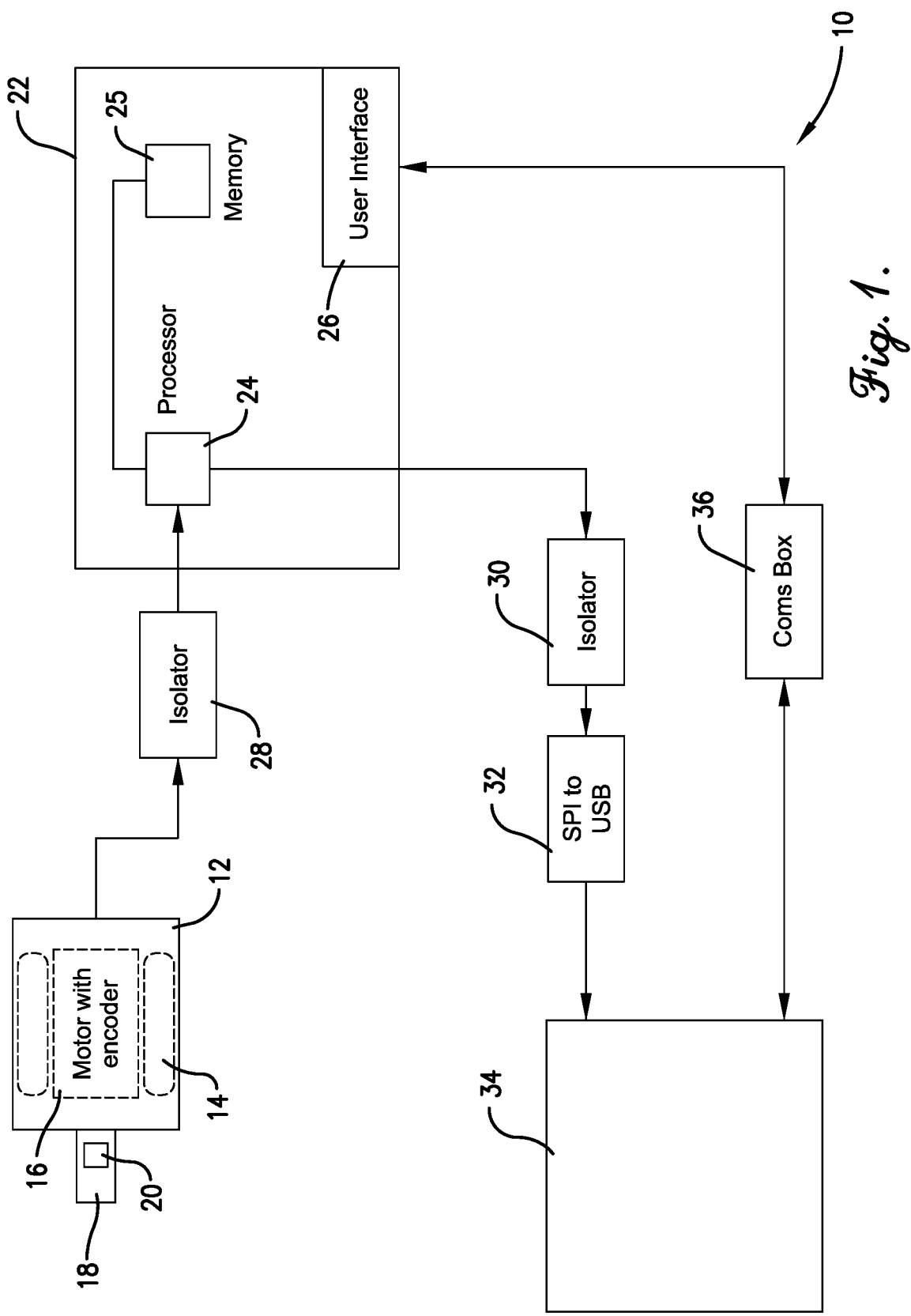
FIG. 1 is a block diagram of an embodiment of a system for reducing an angle error in an estimated position of a rotor over various loads on an electric motor or type of electric motor.

Referring to FIG. 1, an embodiment of a system 10 for reducing an angle error in an estimated position of a rotor over various loads on an electric motor or type of electric motor may broadly comprise an electric motor 12 having a stator 14, a rotor 16, and a shaft 18; an encoder 20; a motor controller 22 having an electronic processing element 24, an EEPROM or other electronic memory element 25, and a user interface 26; first and second isolators 28, 30; a serial peripheral interface bus (SPI) to universal serial bus (USB) adapter 32; a computing device 34; and a communications box 36. The electric motor 12 may be substantially any suitable electric motor, such as a brushless, synchronous, direct current (DC), permanent magnet (PM) motor, configured to drive a load coupled with the shaft 18. The motor 12 may be a representative or representative instance of a type of motor for which the relationship between inductance and current is being determined for the benefit of some or all motors of the same type. The encoder 20 may be coupled with the shaft 18, and configured to determine a position of the rotor 16. The encoder 20 may be used to provide an independent determination of the position of the rotor 16 for comparison with the results of the sensorless algorithm during the determination of the relationship between inductance and current. Because the motor 12 is a sensorless motor, the encoder 20 may have to be added. The orientation of the encoder 20 may not significantly matter.

The motor controller 22 may be otherwise conventionally configured to control the operation of the motor 12. The user interface 26 allows a user to provide instructions to the motor controller 22 for controlling operation of the motor 12. The first isolator 28 may be electrically connected between the motor 12 and the motor controller 22, and configured to electrically isolate signals communicated therebetween, and thereby protect the motor controller 22 from damage. Similarly, the second isolator 30 may be electrically connected between the computing device 34 and the motor controller 22, and configured to electrically isolate signals communicated therebetween, and thereby further protect the motor controller 22 from damage.

The serial peripheral interface bus (SPI) to universal serial bus (USB) adapter 32 may be electrically connected to and between the motor controller 22 and the computing device 34, and configured to facilitate communication therebetween by converting the SPI protocol used by the motor controller 22 to the USB protocol used by the computing device 34. In one implementation, variables stored in the SPI transmit buffer may be transferred once per update cycle. The SPI peripheral may send data from the transmit buffer until the buffer is empty, with no processor overhead or interrupts. In order to keep overhead low on the processor side, there may be no checksum, no cyclic redundancy check (CRC), and no retries for bad data, and data may only be outputted to the computing device 34, with any needed inputs from the computing device 34 being inputted through the communications box 36.

The computing device 34 may be substantially any suitable computing device, such as a general purpose or dedicated, desktop, laptop, tablet, or handheld computer, configured to perform the functionality described below, including receiving data from the processing element 24 and user interface 26 of the motor controller 22, executing data collection software configured to process the received data, transmitting information to the memory element 25 for storage thereon, and transmitting information to the user interface 26 for controlling operation of the motor 12. The communications box 36 may be electrically connected to and between the user interface 26 of the motor controller 22 and the computing device 34, and configured to facilitate communications therebetween using applicable protocols.

Figure 2:
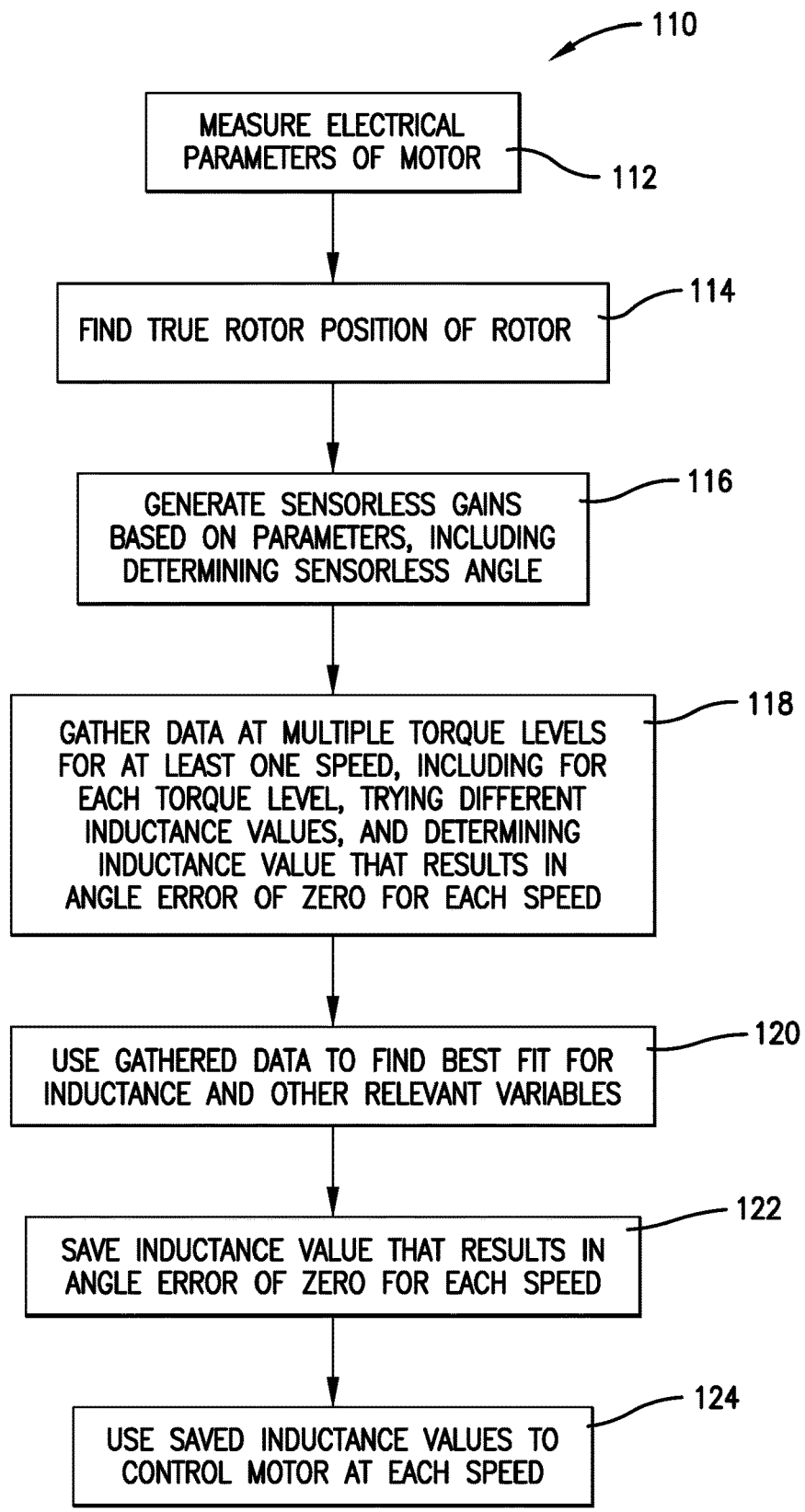
FIG. 2 is a flowchart of steps involved in a computer-implemented method for reducing an angle error in an estimated position of a rotor over various loads on an electric motor or type of electric motor.

Referring also to FIG. 2, the system 10 may function substantially as follows to reduce the angle error in the estimated position of the rotor 16 over various loads on the electric motor 12 or type of electric motor.

One or more electrical parameters of the electric motor 12 may be measured, as shown in 112. A true rotor position of the rotor 16 may be found, as shown in 114. Sensorless gains based on the one or more motor parameters may be generated, including determining a sensorless angle, as shown in 116. Data may be gathered at a plurality of torque levels for at least one speed of the representative electric motor, including for each torque level, trying a plurality of different inductance values, and determining an inductance value that results in an angle error of zero, wherein the angle error is a difference between the true rotor position and the sensorless angle, as shown in 118. The inductance value that results in an angle error of zero for each speed may be saved in the electronic memory 25, as shown in 122. The saved inductance value that results in an angle error of zero for each speed may be used to control the electric motor 12 or a plurality of electric motors of the same type as the electric motor 12, as shown in 124.

Various implementations of the system 10 may include any one or more of the following additional features. The system 10 may be configured to export from the motor controller 22 up to seven (7) variables simultaneously at the highest control loop execution rate (eight (8) kHz). Data may not be buffered but rather streamed to the computing device 34 in real time, so the data may be collected without a pre-determined length. The data collection system may be sufficiently lightweight to be executable on the normal processing element 24 of the motor controller 22. The data collection system may include the ability to isolate and read the encoder 20 so that the real position can be compared to any variable in the motor controller 22.

The system 10 may include more, fewer, or alternative components and/or perform more, fewer, or alternative actions, including those discussed elsewhere herein, and particularly those discussed in the following section describing the computer-implemented method.

Referring again to FIG. 2, an embodiment of a computer-implemented method 110 for improving the functioning of a computer for reducing an angle error in an estimated position of a rotor over various loads on an electric motor may broadly comprise the following steps. Some or all of the steps of the method 110 may be reflected in the functionality of the system 10, just as the functionality of the system 10 may reflect some or all of the steps of the method 110. The method 110 may be performed for one or more representative or representative motors of a particular type of motor in order to increase the efficiency of some, most, or all motors of the type of motor. Additionally or alternatively, the method 110 may be performed for a specific motor in order to increase the efficiency of the specific motor.

One or more electrical parameters (e.g., voltage, current, power) of the motor 12 may be measured, as shown in 112.

Figure 3:
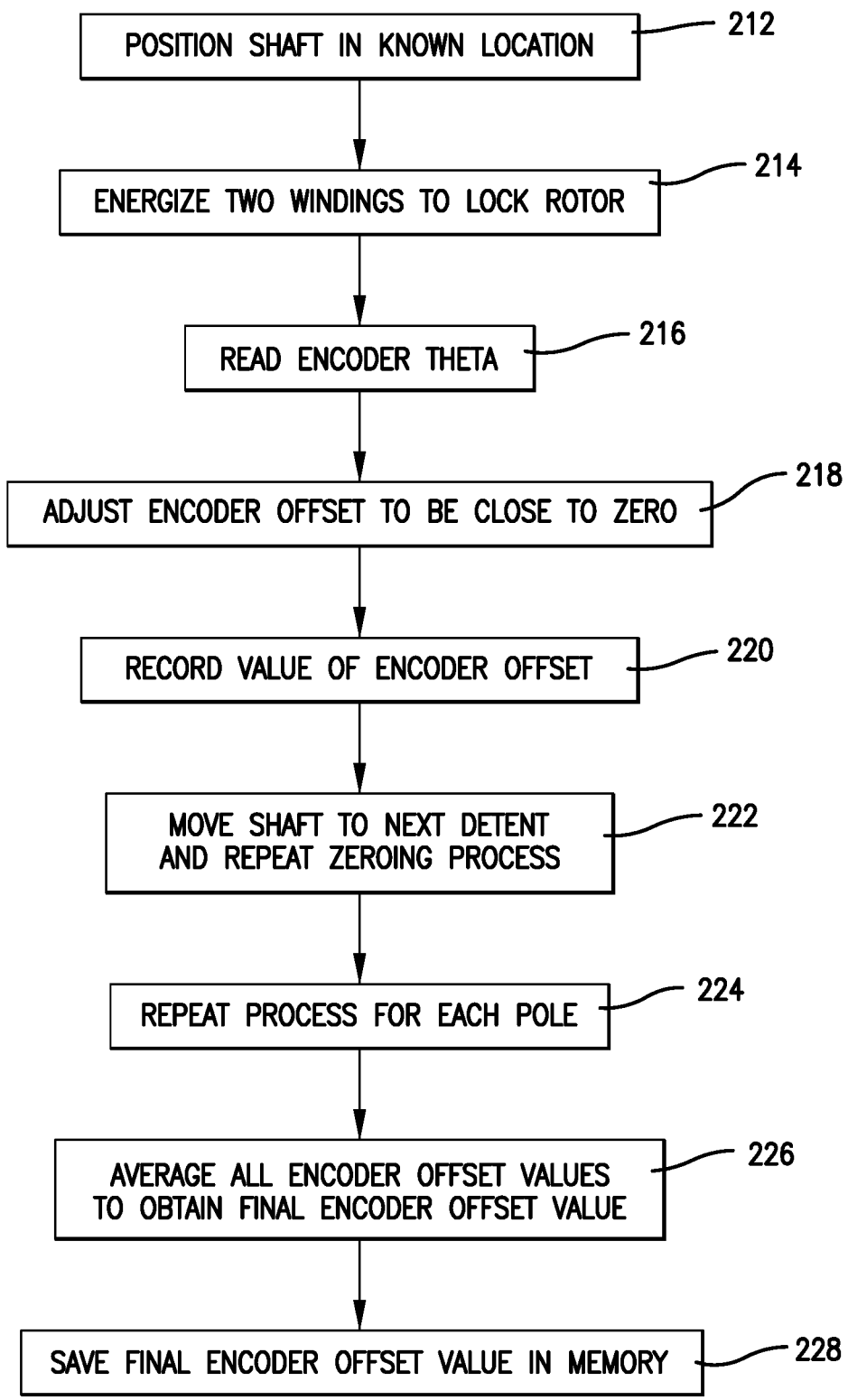
FIG. 3 is a flowchart of substeps involved in a step of the computer-implemented method of FIG. 2.

A true rotor position of the rotor 16 may be found, as shown in 114. Referring also to FIG. 3, an implementation of step 114 may include the following sub steps. Because the motor 12 is a sensorless type of motor (i.e., it uses a sensorless algorithm to determine the position of the rotor 16), the encoder 20 may not be initially present and may need to be added to the shaft 18 before proceeding. The shaft 18 may be positioned in a known location, as shown in 212. A DC power supply may be used to energize two (2) windings to lock the rotor 16, as shown in 214. The power supply should be capable of at least one-half the rated phase current of the motor 12. As an example, the DC power supply may be connected to the motor 12, with the positive lead connected to the C phase of the motor, the negative lead connected to the B phase of the motor, and the A phase left open. Then the encoder theta may be read, as shown in 216. The "encoder theta" is the rotational angle of the motor shaft position, from 0 to 360 degrees or from 0 to 2*pi radians. The encoder offset may be adjusted to be as close to zero (0) as possible, as shown in 218; the value of the encoder offset may be recorded, as shown in 220; the shaft 18 may be mechanically moved to the next detent position and the zeroing process of the previous steps may be repeated, as shown in 222; the overall process may be repeated for each pole of the motor 12, as shown in 224; and the obtained encoder offset values may be averaged to obtain the final encoder offset value, as shown in 226. The true rotor position of the rotor 16 may then be saved by saving the final encoder offset value to the control parameters stored in the EEPROM or other memory element 25 incorporated into or otherwise accessible by the motor controller 22, as shown in 228.

Referring again to FIG. 2, a sensorless gain may be generated based on the motor parameters, including determining a sensorless angle, as shown in 116. Data may be gathered at fixed speed and multiple torque levels, as shown in 118. A speed in the middle of the range of possible speeds may be chosen to run the test. At each torque level, several (e.g., two (2) to four (4), or three (3)) different inductance values may be tried. If one of the inductance values does not produce an angle error of zero, then linear interpolation may be used to find the inductance value that will result in an angle error of zero. Data may be gathered at three (3) to six (6), or four (4) or five (5), torque levels over a range of ten percent (10%) to one hundred percent (100%) of full load torque. The gathered data is the angle error, i.e., it is the difference between the true rotor position and the sensorless angle. The varied parameters are Lconst and RLconst. "Lconst" is the constant offset or slope parameter of the machine electrical inductance "L" from the motor winding design, and is measured in units of Henries). "RLconst" is the constant offset or slope parameter machine electrical impedance "RL" from the motor winding design, and is measured in units of Ohms. Resistance is held constant so the two parameters are varied together based on inductance.

Figure 4:
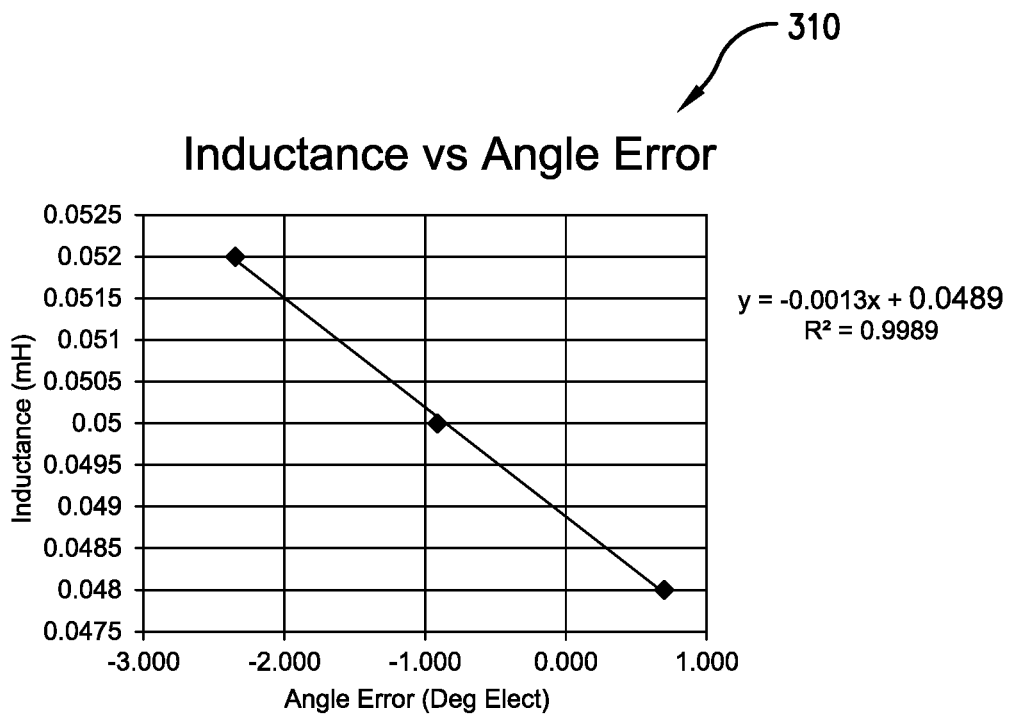
FIG. 4 is a graph of inductance versus angle error.
Figure 5:
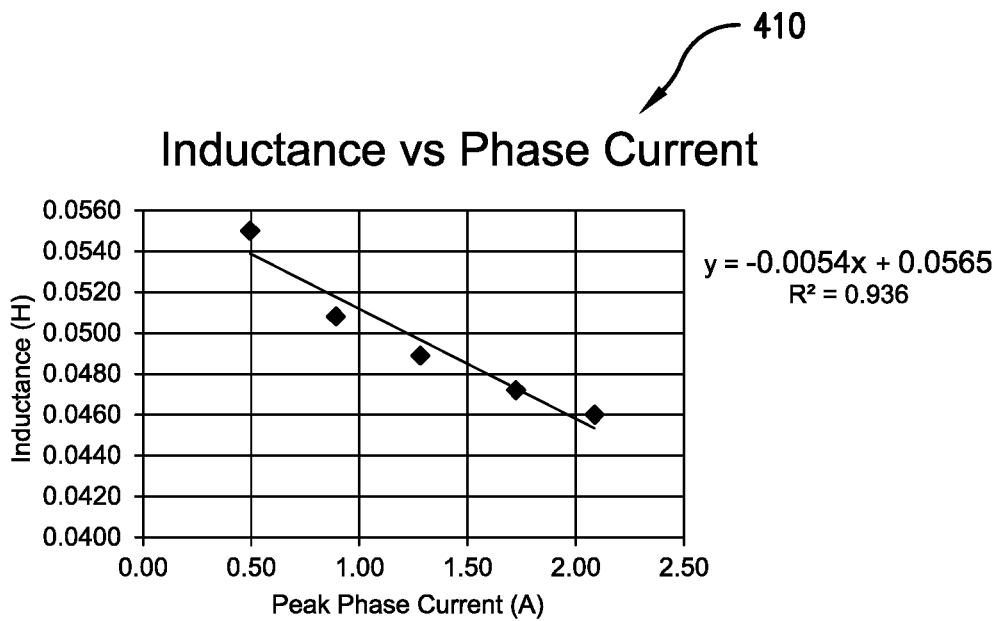
FIG. 5 is a graph of inductance versus phase current.

In an example, FIG. 4 shows a graph 310 of inductance (mH) versus angle error (degrees) for a one-half horsepower high efficiency copper motor with a load of 15 in*lbs. Three data points are shown. The formula for the linear fit line is y=−0.0013x+0.0489. FIG. 5 shows a graph 410 of inductance (mH) versus peak phase current (A) for the same motor. The formula for this linear fit line is y=−0.0054x+0.0565.

The gathered data may be used to find the best fit for Lconst, Lgain, RLconst, and RLgain, as shown in 120. "Lgain" is the gain or intercept parameter of the machine electrical inductance "L" from the motor winding design, and is measure din units of Henries. "RLgain" is the gain or intercept parameter machine electrical impedance "RL" from the motor winding design, and is measured in units of Ohms. Normally, the inductance values that result in an angle error of zero fit a linear curve well, though at the lower torque levels there can be some deviation from the linear curve. The linear fit parameters may be stored in the EEPROM or other memory element 25 incorporated into or otherwise accessible by the motor controller 22, as shown in 122. Each type of motor may have a different set of linear fit parameters. The motor 12 may then be run over the full speed and torque range of its expected operation. For example, a motor with a maximum speed of twelve hundred (1200) RPM, may have four (4) speeds, five hundred (500), nine hundred (900), one thousand fifty (1050), and twelve hundred (1200) RPM, with three (3) torque points at each speed, thirty three percent (33%), sixty six percent (66%), and one hundred percent (100%) of the rated torque. Angle error data and electrical parameter data (e.g., voltage, current, power) may be gathered, and the angle error may be checked at each torque point, and the electrical data may be checked against the best operating data from the testing of the motor 12.

Figure 6:
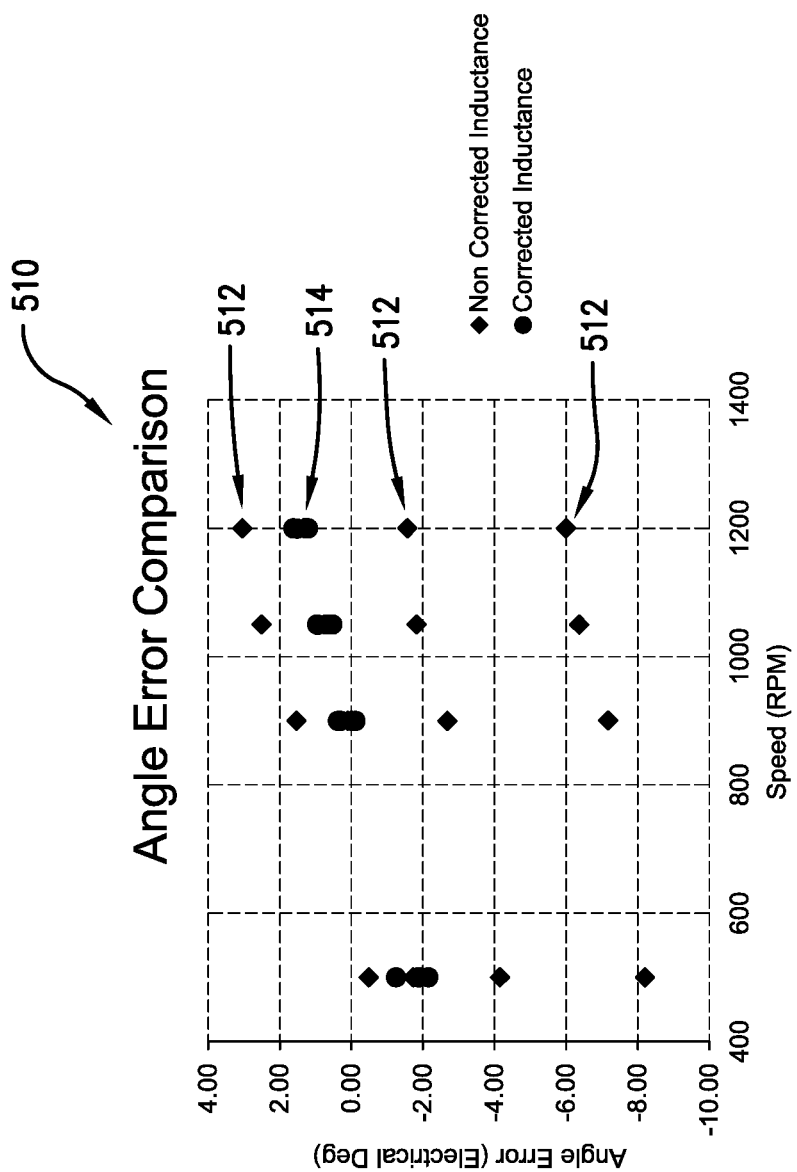
FIG. 6 is a graph of angle error versus speed for both corrected inductance and non-corrected inductance to illustrate the improvement provided by the system of FIG. 1 and the computer-implemented method of FIG. 2.

Based on the results obtained with the representative or representative motor 12, the motor controllers of some, most, or all motors of the type of motor may be configured to use the inductance value that results in an angle error of zero for each speed to control the motors at each speed, as shown in 124. FIG. 6 shows a graph 510 of angle error (degrees) versus speed (RPM) for the one-half horsepower (½ HP) high efficiency copper motor for both uncorrected and correct inductance. With uncorrected inductance 512, the angle error of the motor varied from approximately negative eight (−8) degrees to positive three (+3) degrees, which is a range of approximately eleven (11) degrees, over the four (4) speeds. With corrected inductance 514, the range was reduced to four (4) degrees over the four (4) speeds.

The computer-implemented method 110 may include more, fewer, or alternative actions, including those discussed elsewhere herein.

Although the invention has been described with reference to the one or more embodiments illustrated in the figures, it is understood that equivalents may be employed and substitutions made herein without departing from the scope of the invention as recited in the claims.

Having thus described one or more embodiments of the invention, what is claimed as new and desired to be protected by Letters Patent includes the following:

1. A computer-implemented method for improving the functioning of a computer for reducing an angle error in an estimated position of a rotor over a plurality of loads in an electric motor, the computer-implemented method comprising:
   gathering data at a plurality of torque levels for at least one speed of the electric motor, including for each torque level, trying a plurality of different inductance values, and determining an inductance value that results in an angle error of zero; and
   saving the inductance value that results in an angle error of zero for each speed in an electronic memory of a motor controller of the electric motor, wherein the inductance value that results in an angle error of zero for each speed of the at least one speed is used by the motor controller to control operation of the electric motor, including synchronizing the rotor and a stator.

2. The computer-implemented method of claim 1, wherein there are between three and six torque levels.

3. The computer-implemented method of claim 1, wherein there are between two and six speeds.

4. The computer-implemented method of claim 1, further including, given the data from the plurality of different inductance values, using interpolation to find the inductance value that results in the angle error of zero.

5. A computer-implemented method for improving the functioning of a motor controller for reducing an angle error in a type of electric motor, wherein the type of electric motor has a rotor, a stator, a shaft, an encoder mounted on the shaft, and a plurality of windings, the computer-implemented method comprising:
   measuring one or more electrical parameters of a representative electric motor of the type of electric motor;
   finding a true rotor position of the rotor of the representative electric motor;
   generating sensorless gains based on the one or more motor parameters, including determining a sensorless angle;
   gathering data at a plurality of torque levels for at least one speed of the representative electric motor, including for each torque level, trying a plurality of different inductance values, and determining an inductance value that results in an angle error of zero, wherein the angle error is a difference between the true rotor position and the sensorless angle; and
   saving the inductance value that results in an angle error of zero for each speed in an electronic memory of the motor controller of each electric motor of a plurality of electric motors of the type of electric motor, wherein the inductance value that results in an angle error of zero for each speed of the at least one speed is used by the motor controller of each electric motor to control operation of each electric motor of the plurality of electric motors.

6. The computer-implemented method of claim 5, wherein the one or more parameters include voltage, current, and power.

7. The computer-implemented method of claim 5, wherein finding the true rotor position includes
   positioning the shaft of the representative electric motor in a known location;
   energizing two windings to lock the rotor;
   performing a zeroing process;
   moving the shaft to a next position and repeating the zeroing process;
   repeating the foregoing steps for each pole of a plurality of poles in the electric motor;
   averaging the encoder offsets for each pole to obtain a final encoder offset, wherein the final encoder offset is the true rotor position; and
   saving the true rotor position in an electronic memory.

8. The computer-implemented method of claim 7, wherein performing the zeroing process includes
   reading an encoder theta;
   adjusting an encoder offset so that the encoder theta is close to zero; and
   recording the encoder offset.

9. The computer-implemented method of claim 7, wherein energizing the two windings includes
   connecting a positive lead of a direct current power supply to a C phase winding of the representative electric motor;
   connecting a negative lead of the direct current power supply to a B phase winding of the representative electric motor; and leaving an A phase winding of the representative electric motor open, wherein the direct current power supply generates at least one-half the rated phase current of the representative electric motor.

10. The computer-implemented method of claim 5, wherein there are between three and six torque levels.

11. The computer-implemented method of claim 5, wherein there are between two and six speeds.

12. The computer-implemented method of claim 5, further including, given the data from the plurality of different inductance values, using interpolation to find the inductance value that results in the angle error of zero.

13. A computer-implemented method for improving the functioning of a motor controller for reducing an angle error in an estimated position of a rotor over a plurality of loads in a type of electric motor, wherein the type of electric motor has the rotor, a stator, a shaft, an encoder mounted on the shaft, and a plurality of windings, the computer-implemented method comprising:
measuring one or more electrical parameters of a representative electric motor of the type of electric motor;
finding a true rotor position of the rotor of the representative electric motor;
generating sensorless gains based on the one or more motor parameters, including determining a sensorless angle;
gathering data at a plurality of torque levels for at least one speed of the representative electric motor, including for each torque level, trying a plurality of different inductance values, and determining an inductance value that results in an angle error of zero, wherein the angle error is a difference between the true rotor position and the sensorless angle; and
saving the inductance value that results in an angle error of zero for each speed in an electronic memory of the motor controller of each electric motor of a plurality of electric motors of the type of electric motor, wherein the inductance value that results in an angle error of zero for each speed of the at least one speed is used by the motor controller of each electric motor to control operation of each electric motor of the plurality of electric motors, including synchronizing the rotor and the stator.

14. The computer-implemented method of claim 13, wherein the one or more parameters include voltage, current, and power.

15. The computer-implemented method of claim 13, wherein finding the true rotor position includes
positioning the shaft of the representative electric motor in a known location;
energizing two windings to lock the rotor;
performing a zeroing process;
moving the shaft to a next position and repeating the zeroing process;
repeating the foregoing steps for each pole of a plurality of poles in the electric motor;
averaging the encoder offsets for each pole to obtain a final encoder offset, wherein the final encoder offset is the true rotor position; and
saving the true rotor position in an electronic memory.

16. The computer-implemented method of claim 15, wherein performing the zeroing process includes
reading an encoder theta;
adjusting an encoder offset so that the encoder theta is close to zero; and
recording the encoder offset.

17. The computer-implemented method of claim 15, wherein energizing the two windings includes
connecting a positive lead of a direct current power supply to a C phase winding of the representative electric motor;
connecting a negative lead of the direct current power supply to a B phase winding of the representative electric motor; and
leaving an A phase winding of the representative electric motor open,
wherein the direct current power supply generates at least one-half the rated phase current of the representative electric motor.

18. The computer-implemented method of claim 13, wherein there are between three and six torque levels.

19. The computer-implemented method of claim 13, wherein there are between two and six speeds.

20. The computer-implemented method of claim 13, further including, given the data from the plurality of different inductance values, using interpolation to find the inductance value that results in the angle error of zero.

* * * * *